US012640731B2

(12) United States Patent
Dwivedi

(10) Patent No.: US 12,640,731 B2
(45) Date of Patent: May 26, 2026

(54) DYNAMIC ELEMENT MATCHING OF BIPOLAR JUNCTION TRANSISTORS FOR IMPROVED PROPORTIONAL TO ABSOLUTE TEMPERATURE VOLTAGE DETERMINATION

(71) Applicant: STMICROELECTRONICS INTERNATIONAL N.V., Geneva (CH)

(72) Inventor: Atul Dwivedi, Benares (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 162 days.

(21) Appl. No.: 18/750,277

(22) Filed: Jun. 21, 2024

(65) Prior Publication Data

US 2025/0015795 A1 Jan. 9, 2025

Related U.S. Application Data

(60) Provisional application No. 63/525,036, filed on Jul. 5, 2023.

(51) Int. Cl.
| | |
|---|---|
| *H03K 17/14* | (2006.01) |
| *H03K 17/30* | (2006.01) |
| *H03K 17/60* | (2006.01) |

(52) U.S. Cl.
CPC ............. *H03K 17/14* (2013.01); *H03K 17/30* (2013.01); *H03K 17/602* (2013.01)

(58) Field of Classification Search
CPC ................. H03K 17/14; H03K 17/145; H03K 19/00369; G01K 7/01; G01K 7/00; G01K 7/015
See application file for complete search history.

(56) References Cited

U.S. PATENT DOCUMENTS

| | | | |
|---|---|---|---|
| 12,209,919 B1* | 1/2025 | Panja | ...................... G01K 7/01 |
| 2015/0003490 A1 | 1/2015 | Ash et al. | |

(Continued)

FOREIGN PATENT DOCUMENTS

CN 115014567 A 9/2022

OTHER PUBLICATIONS

Qin et al., "An Energy-Efficient BJT-Based Temperature Sensor with ±0.8° C.(3 ) Inaccuracy from -50 to 150° C." Sensors 22, No. 23: 9381. China, (Dec. 2022).

(Continued)

*Primary Examiner* — Hai L Nguyen
(74) *Attorney, Agent, or Firm* — Alston & Bird LLP

(57) ABSTRACT

An integrated circuit comprises a current source, a plurality of parallel transistors, a plurality of switches, switch control circuitry, and measurement circuitry. Each switch selectively couples the current source to a corresponding transistor. The switch control circuitry is configured to, at different times, cause all the switches to close and, separately for each transistor, cause the switch associated with each transistor to close while causing all other switches to open. The measurement circuitry is configured to measure, separately for each of the transistors, a base-emitter voltage (VBE) when all the switches are closed and a VBE when only the switch associated with each transistor is closed, determine a ΔVBE for each of the plurality of transistors by calculating a difference between the VBE when only the switch associated with each transistor is closed and the VBE when all the switches are closed, and calculate an average of all the ΔVBEs.

20 Claims, 7 Drawing Sheets

(56) References Cited

U.S. PATENT DOCUMENTS

2015/0276497 A1  10/2015  Miyazaki et al.
2018/0356294 A1  12/2018  Kamath et al.
2021/0239540 A1   8/2021  Dwivedi et al.

OTHER PUBLICATIONS

R. J. van der Plassche, "Dynamic element matching for high-accuracy monolithic D/A converters," IEEE Journal of Solid-State Circuits, vol. SC-11, No. 6, pp. 795-800, Dec. 1976.

\* cited by examiner

DYNAMIC ELEMENT MATCHING OF BIPOLAR JUNCTION TRANSISTORS FOR IMPROVED PROPORTIONAL TO ABSOLUTE TEMPERATURE VOLTAGE DETERMINATION

CROSS-REFERENCE TO RELATED APPLICATIONS

This application claims priority to and the benefit of U.S. Provisional Patent Application Ser. No. 63/525,036, filed Jul. 5, 2023, and titled "DYNAMIC ELEMENT MATCHING OF BIPOLAR JUNCTION TRANSISTORS FOR IMPROVED PROPORTIONAL TO ABSOLUTE TEMPERATURE VOLTAGE DETERMINATION," which is incorporated herein by reference in its entirety.

FIELD OF THE INVENTION

Example embodiments of the present disclosure relate generally to electronic circuits and, more particularly, to dynamic element matching for an integrated circuit.

BACKGROUND

Applicant has identified many technical challenges and difficulties associated with temperature measurement using a proportional to absolute temperature voltage. Through applied effort, ingenuity, and innovation, Applicant has solved problems related to temperature measurement using a proportional to absolute temperature voltage by developing solutions embodied in the present disclosure, which are described in detail below.

BRIEF SUMMARY

Various embodiments described herein relate to systems, apparatuses, products, and methods for temperature measurement using a PTAT voltage.

In accordance with some embodiments of the present disclosure, an example integrated circuit is provided. In some embodiments, the example integrated circuit comprises a current source, a plurality of transistors arranged in parallel, a plurality of switches, switch control circuitry, and measurement circuitry. Each of the plurality of transistors has an emitter and a base. Each of the plurality of switches selectively couples the current source to the emitter of a corresponding one of the plurality of transistors such that a bias current flows from the current source to the emitter of a respective one or more of the plurality of transistors when a respective one or more switches is closed. The switch control circuitry is configured to, at different times, cause all the switches to close and, separately for each transistor, cause the switch associated with each transistor to close while causing all other switches to open. The measurement circuitry is coupled to each of the plurality of transistors between each respective switch and the emitter of each respective transistor. The measurement circuitry is configured to measure, separately for each of the plurality of transistors, a base-emitter voltage (VBE) when all the switches are closed and a VBE when only the switch associated with each transistor is closed. The measurement circuitry is further configured to determine a ΔVBE for each of the plurality of transistors by calculating, for each of the plurality of transistors, a difference between the VBE when only the switch associated with each transistor is closed and the VBE when all the switches are closed. The measurement circuitry is further configured to calculate an average of all of the determined ΔVBEs.

In some embodiments, the measurement circuitry is further configured to calculate a temperature based on the calculated average of all of the determined ΔVBEs.

In some embodiments, the measurement circuitry comprises an analog-to-digital converter for converting the calculated average of all of the determined ΔVBEs from an analog value to a digital value.

In some embodiments, each of the plurality of transistors comprises a bipolar junction transistor.

In some embodiments, each of the plurality of bipolar junction transistor comprises a parasitic bipolar junction transistor of the complementary metal-oxide semiconductor (CMOS) technology.

In some embodiments, the plurality of transistors comprise four to eight transistors.

In some embodiments, the bias current from the current source is selected to be within an operating region of the plurality of transistors.

In some embodiments, the bias current from the current source is selected to be between a high injection region and a low injection region of the plurality of transistors.

In accordance with some embodiments of the present disclosure, an example method is provided. In some embodiments, the example method comprises, for each of a plurality of transistors arranged in parallel, each of the plurality of transistors having an emitter and a base, the emitter of each of the plurality of transistors selectively coupled to a current source via a respective one of a plurality of switches such that a bias current flows from the current source to the emitter of a respective one or more of the plurality of transistors when a respective one or more switches is closed, separately measuring a base-emitter voltage (VBE) when all the switches are closed and a VBE when only the switch associated with each transistor is closed; determining a ΔVBE for each of the plurality of transistors by calculating, for each of the plurality of transistors, a difference between the VBE when only the switch associated with each transistor is closed and the VBE when all the switches are closed; calculating an average of all of the determined ΔVBEs; and calculating a temperature using the average of all of the determined ΔVBEs.

In some embodiments, the method further comprises converting each of the measured VBEs from an analog value to a digital value.

In some embodiments, each of the plurality of transistors comprises a bipolar junction transistor.

In some embodiments, each of the plurality of bipolar junction transistor comprises a parasitic bipolar junction transistor of the CMOS technology.

In some embodiments, the plurality of transistors comprise four to eight transistors.

In some embodiments, the bias current from the current source is selected to be within an operating region of the plurality of transistors.

In some embodiments, the bias current from the current source is selected to be between a high injection region and a low injection region of the plurality of transistors.

In accordance with some embodiments of the present disclosure, an example temperature sensor is provided. In some embodiments, the example temperature sensor comprises a current source, a plurality of transistors arranged in parallel, a plurality of switches, switch control circuitry, and measurement circuitry. Each of the plurality of transistors has an emitter and a base. Each of the plurality of switches selectively couples the current source to the emitter of a corresponding one of the plurality of transistors such that a bias current flows from the current source to the emitter of a respective one or more of the plurality of transistors when a respective one or more switches is closed. The switch control circuitry is configured to, at different times, cause all the switches to close and, separately for each transistor, cause the switch associated with each transistor to close while causing all other switches to open. The measurement circuitry is coupled to each of the plurality of transistors between each respective switch and the emitter of each respective transistor. The measurement circuitry is configured to measure, separately for each of the plurality of transistors, a base-emitter voltage (VBE) when all the switches are closed and a VBE when only the switch associated with each transistor is closed. The measurement circuitry is further configured to determine a ΔVBE for each of the plurality of transistors by calculating, for each of the plurality of transistors, a difference between the VBE when only the switch associated with each transistor is closed and the VBE when all the switches are closed. The measurement circuitry is further configured to calculate an average of all of the determined ΔVBEs.

In some embodiments, the measurement circuitry is further configured to calculate a temperature based on the calculated average of all of the determined ΔVBEs.

In some embodiments, the measurement circuitry comprises an analog-to-digital converter for converting the calculated average of all of the determined ΔVBEs from an analog value to a digital value. Alternatively, each ΔVBE can be sampled, amplified, and digitized by the ADC and its digital value can be stored. Once all the amplified ΔVBEs are digitized, they can be averaged in the digital domain.

In some embodiments, each of the plurality of transistors comprises a bipolar junction transistor.

In some embodiments, the bias current from the current source is selected to be within an operating region of the plurality of transistors.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION OF THE INVENTION

Figure 1:
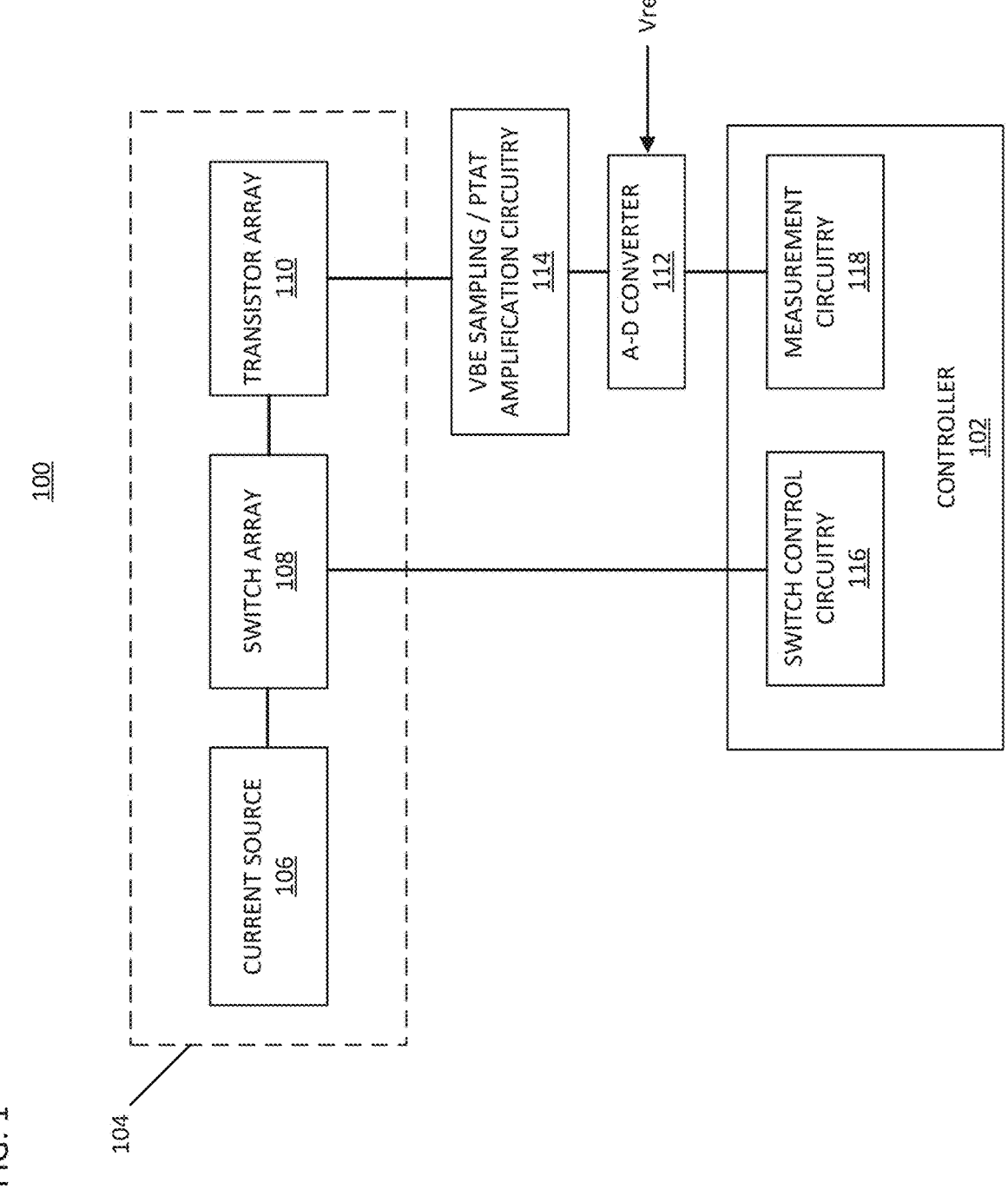
FIG. 1 illustrates a block diagram of an example system for temperature measurement using a proportional to absolute temperature voltage, in accordance with an example embodiment of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

With increasing density and operating speeds of integrated circuits (ICs), among other factors, in some contexts it is important monitor the temperature of an integrated circuit. If the temperature gets too high (for example, above 85 degrees Celsius), the IC can be damaged. If the temperature of an IC is sensed to be increasing, remedial actions can be taken to reduce the temperature. For example, in some contexts the remedial actions may include reducing the frequency and/or the voltage of the IC.

One approach that has been used to determine the temperature of an IC uses a proportional to absolute temperature (PTAT) voltage. When using a PTAT voltage for temperature sensing, it is important to be able to determine the PTAT voltage to a desirable accuracy. One approach that has been used to determine PTAT voltage is to calculate the difference between base-emitter voltages of two bipolar junction transistors (BJTs) biased at different current densities. However, the accuracy of this approach is limited by the accuracy of the biasing current ratio, which is sensitive to mismatch errors.

Errors due to mismatch between the current sources and transistors can be reduced by dynamically interchanging them. This technique is referred to as dynamic element matching (DEM). One approach that has been used implements DEM in the current sources biasing the BJTs. Since MOS (metal oxide semiconductor) current sources have very high mismatch to begin with, the residual inaccuracy even after DEM of these current sources may not be low enough. Moreover, the previous attempt to implement DEM in BJTs while using only one current source was prone to switch IR drop mismatch, which further degraded performance.

Various embodiments of the present disclosure overcome the above technical challenges and difficulties, and provide various technical improvements and advantages. For example, various embodiments of the present disclosure provide an example system for generating a PTAT voltage using dynamic element matching of BJTs in a way that is not accuracy limited by switch resistance or current source mismatch, and therefore achieves better accuracy than other approaches that have been used. Various embodiments of the present disclosure provide at least an integrated circuit, method, and temperature sensor that obtain a more accurate ΔVBE.

Various embodiments of the present disclosure use only one current source, thereby eliminating the current source mismatch. Further, various embodiments of the present disclosure sample the base-emitter voltage (VBE) of the same BJT at different current densities. Yet further, various embodiments of the present disclosure sample the VBEs (at different current densities) at the emitter of each BJT, thereby eliminating switch IR drop mismatch.

Various embodiments of the present disclosure obtain the higher current density VBE1 by flowing the entire bias current in one BJT and obtain the lower current density VBE2 by flowing the bias current across a plurality of such BJTs arranged in parallel (the number of BJTs may vary as described below and may be expressed as "p"). Various embodiments of the present disclosure reduce BJT mismatch by sampling all such pairs of VBEs from different BJTs, resulting in p different ΔVBEs. Various embodiments of the present disclosure average the p different ΔVBEs, resulting in a ΔVBEavg value. The averaging of the ΔVBEs greatly reduces the effect of BJT mismatch in the resultant ΔVBEavg. In various embodiments of the present disclosure, the ΔVBEavg value is the PTAT value used for temperature calculation.

Various embodiments of the present disclosure provide a more accurate PTAT voltage and have a smaller footprint as compared to some approaches that have been used due to fewer components being used (for example, only one current source).

Referring now to FIG. 1, a block diagram of an example system 100 for temperature measurement using a PTAT voltage is illustrated in accordance with an example embodiment of the present disclosure. The example system 100 comprises a controller 102, a dynamic element matched circuit 104, a VBE sampling/PTAT amplification circuitry 114, and an analog to digital converter (ADC) 112. The example system 100 may be implemented as part of an IC to perform temperature measurement of the IC. Such an IC may be any IC for which temperature measurement is desirable, such as but not limited to a multi-core processor, central processing units, graphics processing units, digital signal processors, compute-intensive application specific integrated circuits, and the like.

As described further below in relation to FIG. 2, in some embodiments the dynamic element matched circuit 104 comprises a current source 106, a plurality of switches, 108, and a plurality of transistors 110. In some embodiments, each switch of the plurality of switches 108 selectively couples the current source 106 to the emitter of a corresponding one of the plurality of transistors 110 such that a bias current flows from the current source 106 to the emitter of a respective one or more of the plurality of transistors 110 when a respective one or more of the plurality of switches 108 is closed.

In some embodiments, the plurality of transistors comprise a plurality of bipolar junction transistors. In some embodiments, the plurality of bipolar junction transistors comprise a plurality of parasitic bipolar junction transistors of the complementary metal-oxide semiconductor (CMOS) technology. In some embodiments, the current source 106 is a single current source. In some embodiments, the bias current from the current source is selected to be within the operating region of the plurality of transistors. In some embodiments, the bias current from the current source is selected to be between the high injection region and the low injection region of the plurality of transistors.

As depicted in FIG. 1, the example system 100 for temperature measurement using a PTAT voltage includes a controller 102. The controller 102 may include one or more processors, input/output circuitry, data storage media, communications circuitry, and/or other components configured to perform compute operations. In some embodiments, the data storage media may be configured to store information, data, content, applications, instructions, or the like, for enabling the controller 102 to carry out various functions. As such, in some embodiments, the controller 102 may be referred to as functional logic. The controller 102 may be embodied in a number of different ways, for example, in some embodiments, the controller 102 may include one or more processing devices configured to perform independently. Additionally or alternatively, in some embodiments, the controller 102 may include one or more processor(s) configured in tandem via a bus to enable independent execution of instructions, pipelining, and/or multithreading. The use of the terms "controller," "processor," and "processing circuitry" should be understood to include a single core processor, a multi-core processor, multiple processors internal to the controller 102, and/or one or more remote or "cloud" processor(s) external to the controller 102.

In an example embodiment, the controller 102 may be configured to execute instructions stored in the data storage media or otherwise accessible to the processor. Alternatively or additionally, the controller 102 in some embodiments is configured to execute hard-coded functionality. As such, whether configured by hardware or software methods, or by a combination thereof, the controller 102 represents an entity (e.g., physically embodied in circuitry) capable of performing operations according to an embodiment of the present disclosure while configured accordingly. Alternatively or additionally, as another example in some example embodiments, when the controller 102 is embodied as an executor of software instructions, the instructions specifically configure the controller 102 to perform the algorithms embodied in the specific operations described herein when such instructions are executed.

In some embodiments, as illustrated in FIG. 1, the controller 102 comprises current switch control circuitry 116 and measurement circuitry 118. A bias voltage (not illustrated) biases the current source 106 to source a fixed current value when one or more of the plurality of switches 108 are closed. In some embodiments, the switch control circuitry 116 includes hardware, software, firmware, and/or a combination thereof, for selectively causing each of the plurality of switches 108 to open or close, thereby causing bias current from the current source 106 to, depending on the state of the switches (i.e., open or closed), flow to one or more of the plurality of transistors 110, as described further below. In some embodiments, the VBE sampling/PTAT amplification circuitry 114 includes hardware, software, firmware, and/or a combination thereof, for sampling and storing the base-emitter voltage (VBE) of each of the plurality of transistors 110 (such as in a switched capacitor arrangement), determining a ΔVBE for each of the plurality of transistors, calculating an average of all of the determined ΔVBEs, as described further below, and amplifying the PTAT voltage to be fed in the ADC 112 for digitization. In some embodiments, the VBE sampling/PTAT amplification circuitry 114 measures (or samples) the base-emitter voltage (VBE) of each of the plurality of transistors 110 at a low current density and at a high current density and determines a ΔVBE therefrom, as described further below. In some embodiments, the measurement circuitry 118 includes hardware, software, firmware, and/or a combination thereof, for receiving and storing a digitized PTAT voltage with respect to a reference voltage (Vref) from the ADC 112, controlling the timing/sequencing of the VBE sampling/PTAT amplification circuitry 114 and the ADC 112, to calculate a temperature (in degrees C.), and providing a digitized temperature output. In some alternative embodiments, all of the ΔVBEs are sampled and stored together by the VBE sampling/PTAT amplification circuitry 114. In this regard, the result is p*ΔVBE which is the sum of all the ΔVBEs, thereby achieving amplification and averaging at once. In some alternative embodiments, each ΔVBE sample (with or without amplification) can be fed to a delta-sigma based ADC in a random order (DEM), for digitization, thereby taking advantage of the oversampled nature of the ADC to achieve averaging.

Although the components are described with respect to functional limitations, it should be understood that the particular implementations necessarily include the use of particular hardware. It should also be understood that certain of the components described herein may include similar or common hardware. For example, two sets of circuitries may both leverage use of the same processor, network interface, storage medium, or the like to perform their associated functions, such that duplicate hardware is not required for each set of circuitries.

The use of the term "circuitry" as used herein with respect to components of the apparatus should therefore be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, storage media, network interfaces, input/output devices, and the like While the example block diagram of FIG. 1 illustrates an example system 100 for temperature measurement using a PTAT voltage, it is noted that the scope of the present disclosure is not limited to the example system shown in FIG. 1. In some embodiments, an example system for temperature measurement using a PTAT voltage may comprise one or more additional or alternative components.

Figure 2:
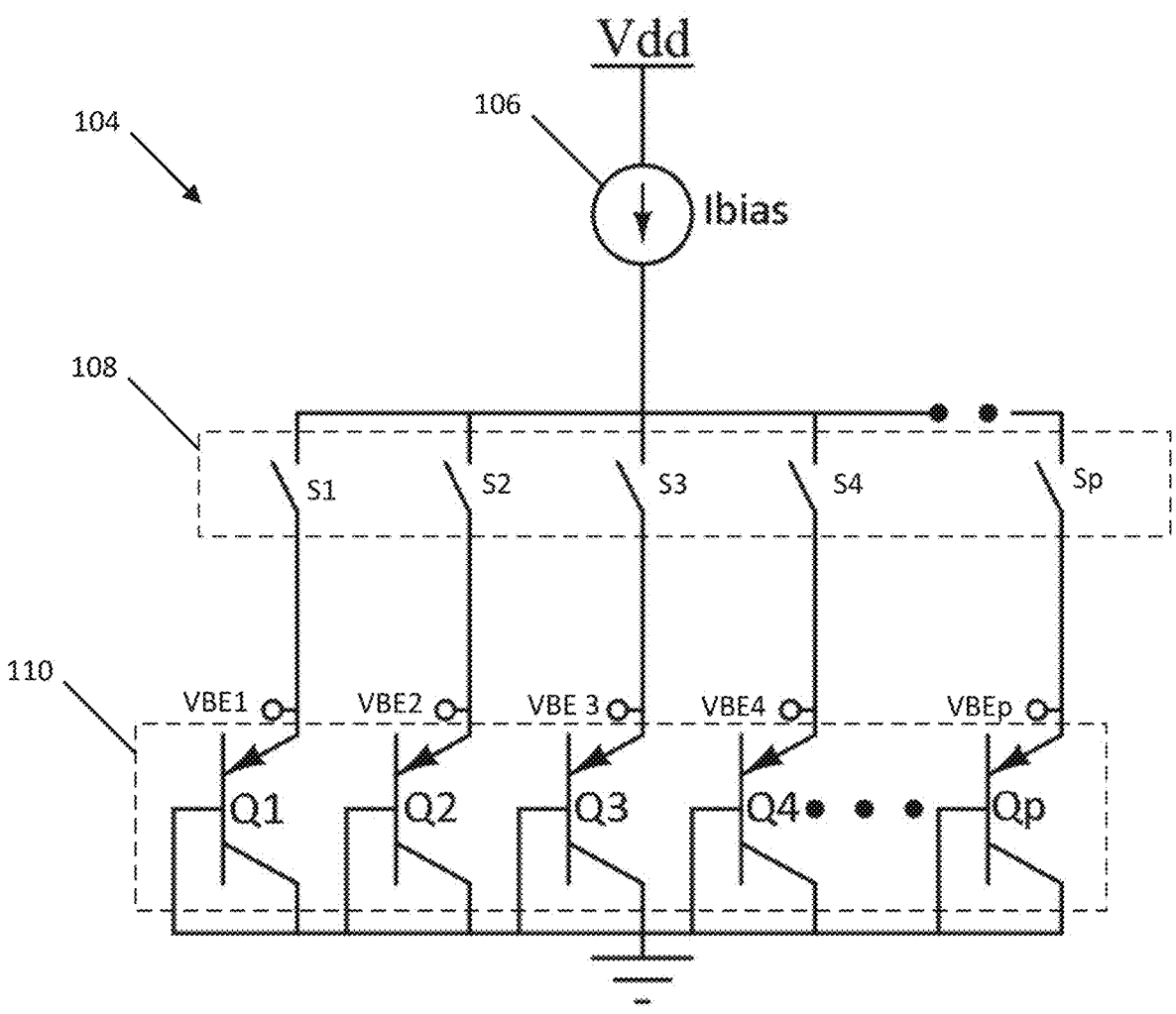
FIG. 2 illustrates a circuit diagram for dynamic element matching of bipolar junction transistors, in accordance with an example embodiment of the present disclosure.

Referring now to FIG. 2, a circuit diagram for dynamic element matching of bipolar junction transistors is illustrated in accordance with an example embodiment of the present disclosure. As seen in FIG. 2, the dynamic element matched circuit 104 comprises a current source 106, a plurality of transistors 110 arranged in parallel, and a plurality of switches 108 therebetween.

In some embodiments, the number of transistors in the dynamic element matched circuit 104 may vary. A smaller number of transistors provides a relatively shorter cycle time but is more susceptible to noise. Conversely, a larger number of transistors is less susceptible to noise but would have a longer cycle time. In some embodiments, the number of transistors is between four and eight. As described herein, the number of transistors may be expressed as "p." In the illustrated embodiment, each of the plurality of transistors 110 is individually labeled as Q1 through Qp to indicate the potentially varying number of transistors.

Each of the plurality of switches 108 selectively couples the current source 106 to the emitter of a corresponding one of the plurality of transistors 110. As such, a bias current ("Ibias") flows from the current source 106 to the emitter of a respective one or more of the plurality of transistors 110 when a respective one or more switches 108 is closed. In the illustrated embodiment, each of the plurality of switches 108 is individually labeled as S1 through Sp to indicate the potentially varying number of switches. As illustrated, switch S1 selectively couples transistor Q1 to the current source 106, switch S2 selectively couples transistor Q2 to the current source 106, switch S3 selectively couples transistor Q3 to the current source 106, and so on.

In some embodiments, as illustrated in FIG. 2, there is a connection point at or adjacent the emitter of each transistor for measuring the VBE of each respective transistor. In the illustrated embodiment, each of the plurality of connection point is individually labeled as VBE1 through VBEp to indicate the potentially varying number of connection points (based on the varying number of transistors). Although not illustrated, in some embodiments each connection point VBE1 through VBEp is coupled to the ADC 112 to enable conversion of the VBE from analog to digital for use in the measurement circuitry 118.

FIGS. 4-7 illustrate the circuit of FIG. 2 in various states of implementation of the present disclosure. The reference numbers 108 and 110 are omitted from FIGS. 4-7 for simplicity.

Figure 3:
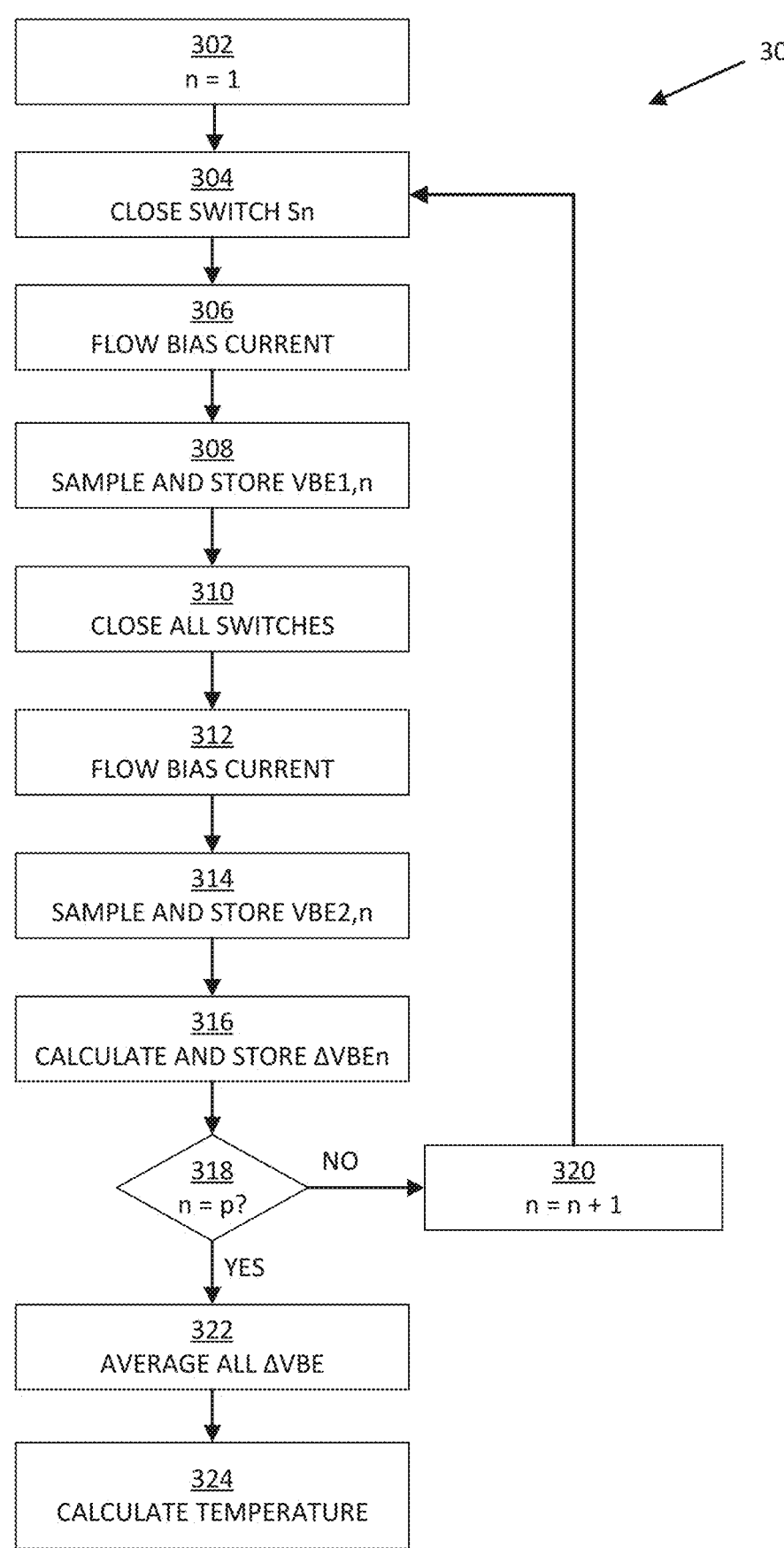
FIG. 3 is an example flow diagram illustrating an example method for temperature measurement using a PTAT voltage, in accordance with an example embodiment of the present disclosure.

Referring now to FIG. 3, an example flow diagram illustrating an example method in accordance with some embodiments of the present disclosure is provided.

It is noted that each block of the flowchart, and combinations of blocks in the flowchart, may be implemented by various means such as hardware, firmware, circuitry and/or other devices associated with execution of software including one or more programming instructions. For example, one or more of the methods described in FIG. 3 may be embodied by programming instructions, which may be stored by a non-transitory memory component of an apparatus employing an embodiment of the present disclosure and executed by one or more processing components in the apparatus. These programming instructions may direct the processing components or other programmable apparatus to function in a particular manner, such that the instructions stored in the non-transitory memory component produce an article of manufacture, the execution of which implements the function specified in the flowchart block(s).

As described above and as will be appreciated based on this disclosure, embodiments of the present disclosure may be configured as methods, devices, and the like. Accordingly, embodiments may comprise various means including entirely of hardware or any combination of software and hardware. Furthermore, embodiments may take the form of a computer program product on at least one non-transitory computer-readable storage medium having computer-readable program instructions (e.g., computer software) embodied in the storage medium. Similarly, embodiments may take the form of a computer program code stored on at least one non-transitory computer-readable storage medium. Any suitable computer-readable storage medium may be utilized including non-transitory hard disks, CD-ROMs, flash memory, optical storage devices, or magnetic storage devices.

Referring now to FIG. 3, an example method 300 in accordance with some embodiments of the present disclosure is illustrated. In particular, the example method 300 illustrates example steps/operations of calculating a temperature using a dynamic element matched circuit, in accordance with some embodiments of the present disclosure.

At step/operation 302, a controller (such as, but not limited to, the controller 102 of the system 100 described above in connection with FIG. 1) sets a counter n to 1. In some embodiments, this counter is used to ensure that the VBE is determined for each transistor in the dynamic element matched circuit 104.

Figure 4:
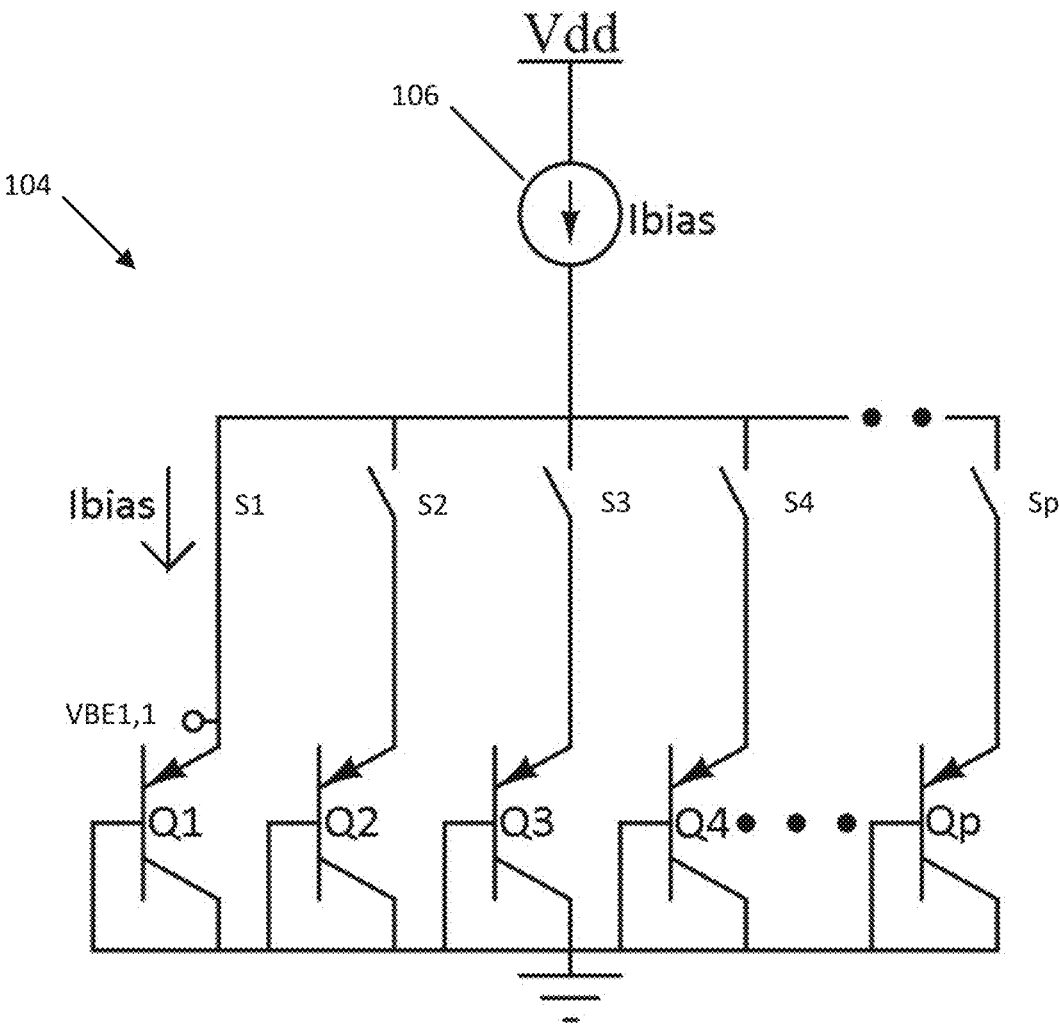
FIGS. 4-7 illustrate the circuit of FIG. 2 in various states of implementation of an example method for temperature measurement using a PTAT voltage, in accordance with an example embodiment of the present disclosure.

At step/operation 304, a controller (such as, but not limited to, the controller 102 of the system 100 described above in connection with FIG. 1, in conjunction with the switch control circuitry 116) causes the nth switch, which at this point is S1, to close while leaving all the other switches open. Referring now to FIG. 4, the dynamic element matched circuit 104 is illustrated with switch S1 closed and all other switches (S2 through Sp) open.

Returning now to FIG. 3, at step/operation 306, a bias current flows from the current source 106 due to the closure of switch S1. Since only switch S1 is closed at this point, the entire bias current flows through switch S1 to transistor Q1 as illustrated in FIG. 4.

Returning now to FIG. 3, at step/operation 308, a controller (such as, but not limited to, the controller 102 of the system 100 described above in connection with FIG. 1, in conjunction with the measurement circuitry 118) measures (or samples) the base-emitter voltage at the emitter of transistor Q1 and stores the measured/sampled value. In some embodiments, this measured (or sampled) VBE is termed VBE1,1, because it is the first VBE measurement through the first transistor. This VBE measurement provides the higher current density for this transistor.

Figure 5:
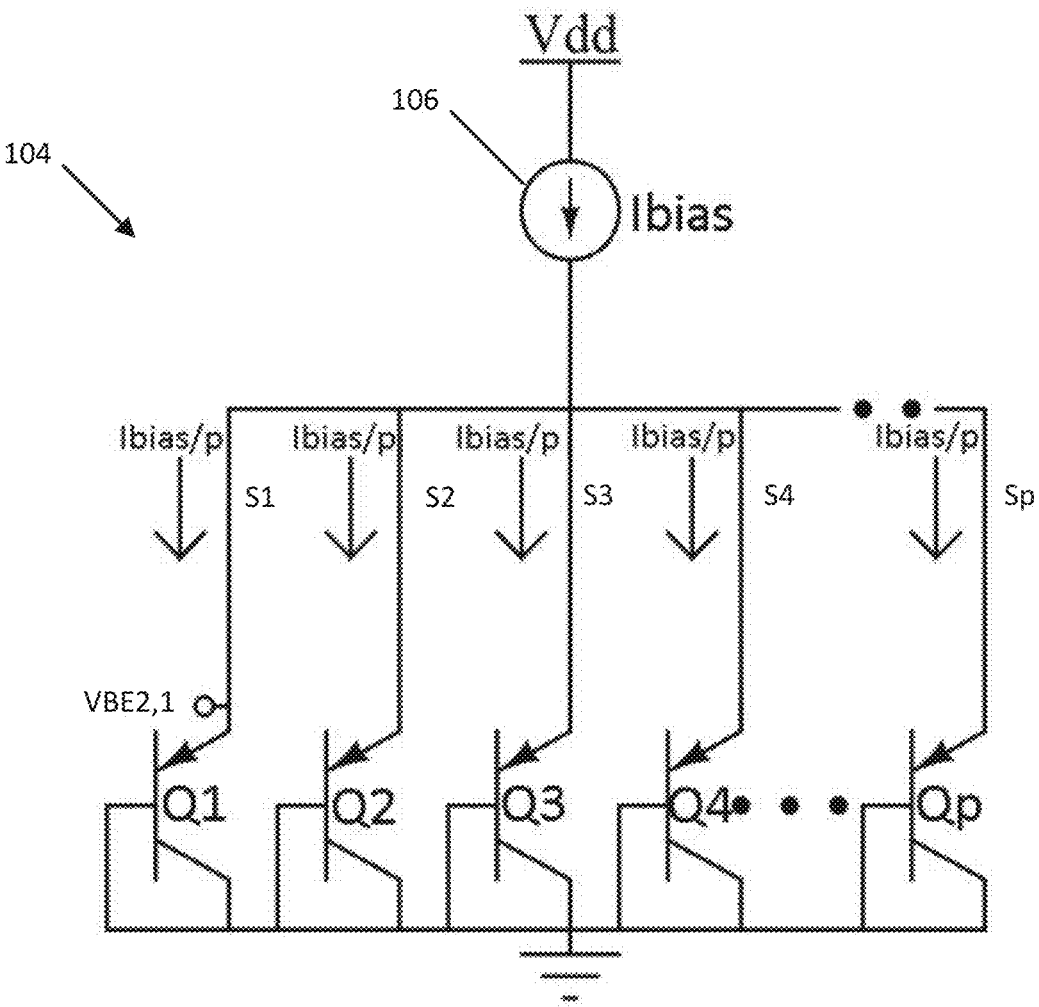

At step/operation 310, a controller (such as, but not limited to, the controller 102 of the system 100 described above in connection with FIG. 1, in conjunction with the switch control circuitry 116) causes all switches to close. Referring now to FIG. 5, the dynamic element matched circuit 104 is illustrated with all switches S1 through Sp closed.

Returning now to FIG. 3, at step/operation 312, a bias current flows from the current source 106 due to the closure of all switches. Since all switches are closed at this point, the bias current flows through all of the switches to all of the transistors as illustrated in FIG. 5. Since the transistors are arranged in parallel, the bias current flowing to each transistor is nominally Ibias/p.

Returning now to FIG. 3, at step/operation 314, a controller (such as, but not limited to, the controller 102 of the system 100 described above in connection with FIG. 1, in conjunction with the measurement circuitry 118) measures (or samples) the base-emitter voltage at the emitter of transistor Q1 and stores the measured/sampled value. In some embodiments, this measured (or sampled) VBE is termed VBE2,1, because it is the second VBE measurement through the first transistor. This VBE measurement provides the lower current density for this transistor.

At step/operation 316, a controller (such as, but not limited to, the controller 102 of the system 100 described above in connection with FIG. 1, in conjunction with the measurement circuitry 118) calculates a ΔVBE for transistor Q1 by subtracting VBE2,1 from VBE1,1 and saves this value (which may be termed ΔVBE1) in memory. Alternatively, this ΔVBE1 (VBE1,1-VBE2,1) maybe stored in a switch capacitor arrangement (and possibly amplified) and digitized for saving.

At step/operation 318, a controller (such as, but not limited to, the controller 102 of the system 100 described above in connection with FIG. 1) determines if the counter value n is equal to the number of transistors p in the dynamic element matched circuit 104. If it is determined at step/operation 318 that the counter value n is not equal to the number of transistors p, the example method 300 proceeds to step/operation 320. At this point in the process, the counter n equals 1, so the example method 300 proceeds to step/operation 320.

At step/operation 320, a controller (such as, but not limited to, the controller 102 of the system 100 described above in connection with FIG. 1) increments the counter by 1 and the example method 300 returns to step/operation 304.

Figure 6:
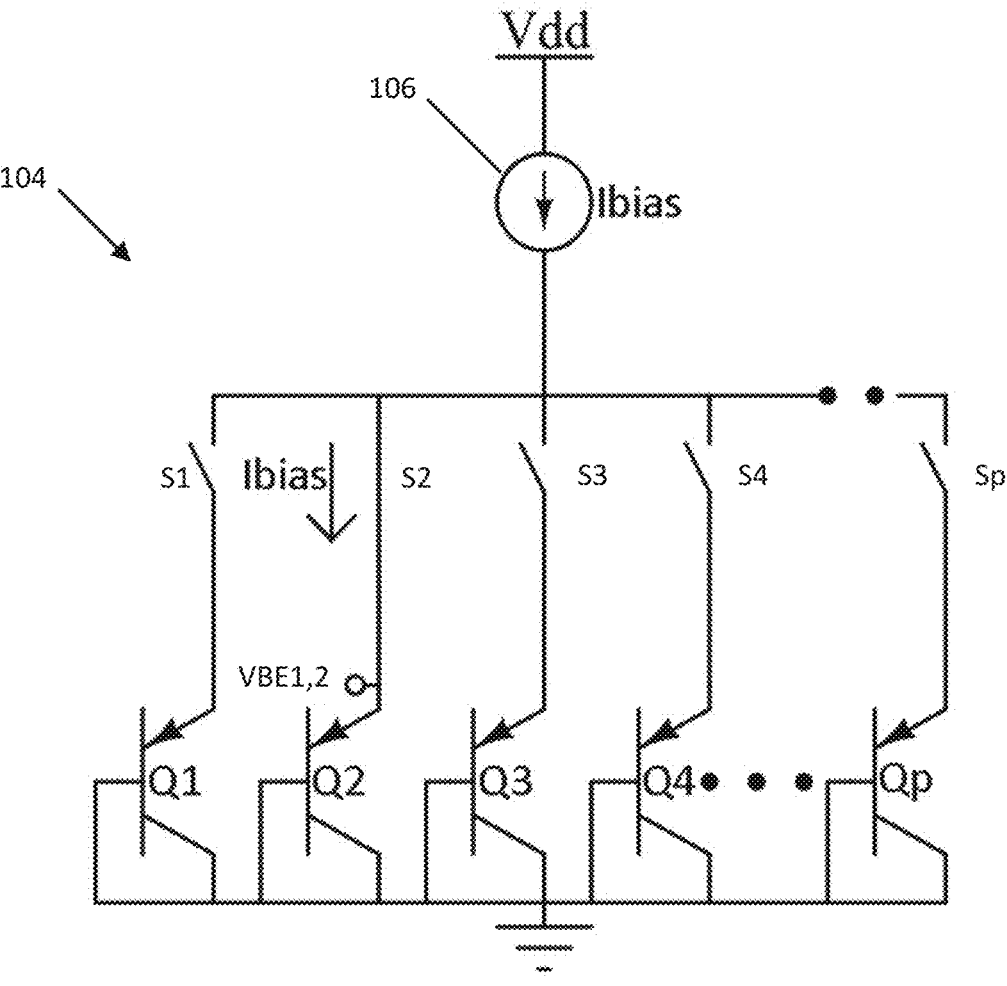

At step/operation 304, a controller (such as, but not limited to, the controller 102 of the system 100 described above in connection with FIG. 1, in conjunction with the switch control circuitry 116) causes the nth switch, which at this point is S2, to close while leaving all the other switches open. Referring now to FIG. 6, the dynamic element matched circuit 104 is illustrated with switch S2 closed and all other switches (S1 and S3 through Sp) open.

Returning now to FIG. 3, at step/operation 306, a bias current flows from the current source 106 due to the closure of switch S2. Since only switch S2 is closed at this point, the entire bias current flows through switch S2 to transistor Q2 as illustrated in FIG. 6.

Returning now to FIG. 3, at step/operation 308, a controller (such as, but not limited to, the controller 102 of the system 100 described above in connection with FIG. 1, in conjunction with the measurement circuitry 118) measures (or samples) the base-emitter voltage at the emitter of transistor Q2. In some embodiments, this measured (or sampled) VBE is termed VBE1,2, because it is the first VBE measurement through the second transistor. This VBE measurement provides the higher current density for this transistor.

At step/operation 310, a controller (such as, but not limited to, the controller 102 of the system 100 described above in connection with FIG. 1, in conjunction with the switch control circuitry 116) causes all switches to close.

Figure 7:
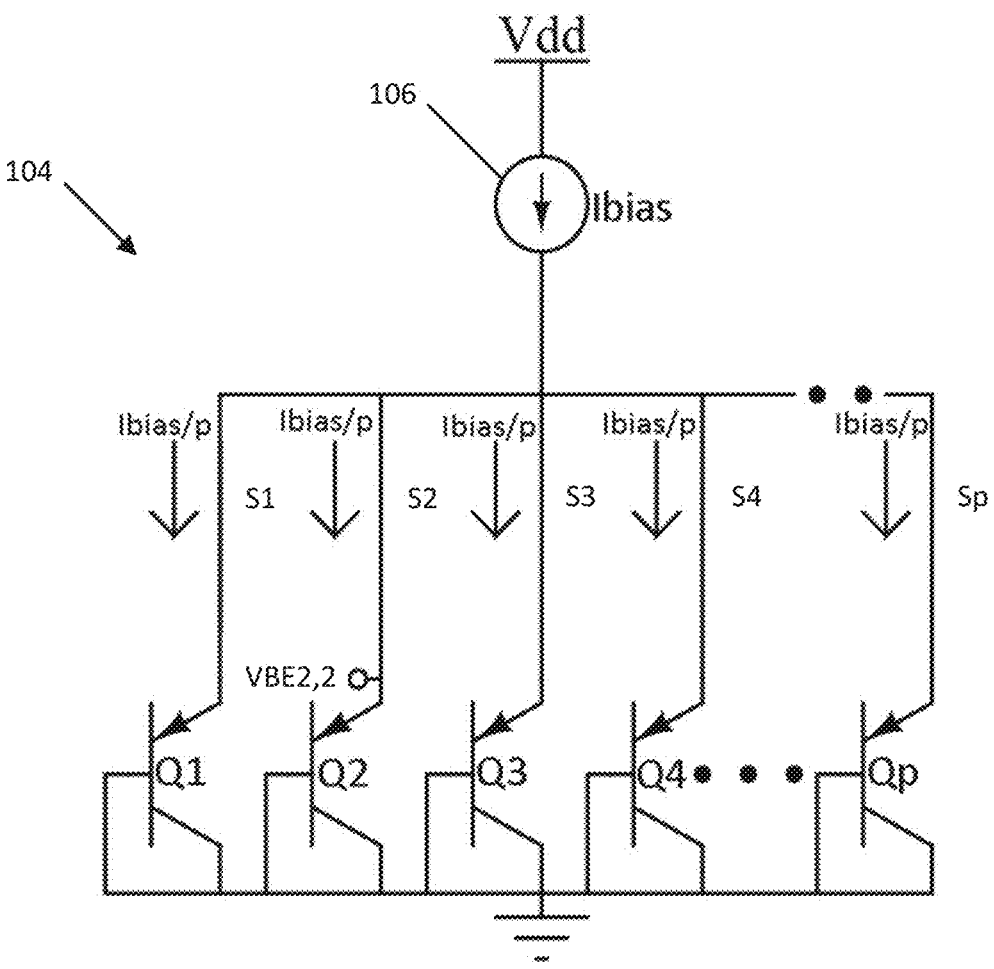

Referring now to FIG. 7, the dynamic element matched circuit 104 is illustrated with all switches S1 through Sp closed.

Returning now to FIG. 3, at step/operation 312, a bias current flows from the current source 106 due to the closure of all switches. Since all switches are closed at this point, the bias current flows through all of the switches to all of the transistors as illustrated in FIG. 7. Since the transistors are arranged in parallel, the bias current flowing to each transistor is nominally Ibias/p.

Returning now to FIG. 3, at step/operation 314, a controller (such as, but not limited to, the controller 102 of the system 100 described above in connection with FIG. 1, in conjunction with the measurement circuitry 118) measures (or samples) the base-emitter voltage at the emitter of transistor Q2. In some embodiments, this measured (or sampled) VBE is termed VBE2,2, because it is the second VBE measurement through the second transistor. This VBE measurement provides the lower current density for this transistor.

At step/operation 316, a controller (such as, but not limited to, the controller 102 of the system 100 described above in connection with FIG. 1, in conjunction with the measurement circuitry 118) calculates a ΔVBE for transistor Q2 by subtracting VBE2,2 from VBE1,2 and saves this value (which may be termed ΔVBE2) in memory. Alternatively, this ΔVBE2 (VBE1,2-VBE2,2) maybe stored in a switch capacitor arrangement (and possibly amplified) and digitized for saving At step/operation 318, a controller (such as, but not limited to, the controller 102 of the system 100 described above in connection with FIG. 1) determines if the counter value n is equal to the number of transistors p in the dynamic element matched circuit 104. If it is determined at step/operation 318 that the counter value n is not equal to the number of transistors p, the example method 300 proceeds to step/operation 320. At this point in the process, the counter n=2, so the example method 300 proceeds to step/operation 320.

Steps/operations 304 through 318 will repeat until the counter value n is equal to the number of transistors p. That is, in some embodiments, steps/operations 304 through 318 will repeat until a ΔVBE is determined for each of the transistors in the dynamic element matched circuit 104. In some embodiments these values of ΔVBE are termed ΔVBE1 through ΔVBEp. If it is determined at step/operation 318 that the counter value n is equal to the number of transistors p, the example method 300 proceeds to step/operation 322.

At step/operation 322, a controller (such as, but not limited to, the controller 102 of the system 100 described above in connection with FIG. 1, in conjunction with the measurement circuitry 118) calculates an average of all of the ΔVBE values (ΔVBE1 through ΔVBEp). This average of all of the ΔVBE values may be termed ΔVBEavg and may be calculated using this formula:

$$\Delta VBEavg = 1/p \sum\nolimits_1^p \Delta VBEn.$$

At step/operation 324, a controller (such as, but not limited to, the controller 102 of the system 100 described above in connection with FIG. 1, in conjunction with the measurement circuitry 118) uses ΔVBEavg as the PTAT voltage to calculate the temperature of the IC. The process of calculating a temperature from a PTAT voltage is conventionally known. In some embodiments, the conventionally known formula $$\Delta VBEavg = \frac{kT}{q} \ln(p)$$

is used to calculate the temperature T. Since k, q, and ln(p) in this formula are constants, ΔVBEavg is multiplied by a conventionally known scalar value and then converted from Kelvin to Celsius.

CONCLUSION

Many modifications and other embodiments of the disclosures set forth herein will come to mind to one skilled in the art to which these disclosures pertain having the benefit of teachings presented in the foregoing descriptions and the associated drawings. Although the figures only show certain components of the apparatus and systems described herein, it is understood that various other components may be used in conjunction with the system. Therefore, it is to be understood that the disclosures are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the disclosure(s) set out in any claims that may issue from this disclosure.

While this detailed description has set forth some embodiments of the present disclosure, the appended claims cover other embodiments of the present disclosure which differ from the described embodiments according to various modifications and improvements. For example, the appended claims can cover any form of integrated circuit for which temperature measurement is desirable, such as but not limited to multi-core processors, digital signal processors, application specific integrated circuits, and the like.

Within the appended claims, unless the specific term "means for" or "step for" is used within a given claim, it is not intended that the claim be interpreted under 35 U.S.C. 112, paragraph 6.

What is claimed is:

1. An integrated circuit comprising:

a current source;

a plurality of transistors arranged in parallel, each of the plurality of transistors having an emitter and a base;

a plurality of switches, each of the plurality of switches selectively coupling the current source to the emitter of a corresponding one of the plurality of transistors such that a bias current flows from the current source to the emitter of a respective one or more of the plurality of transistors when a respective one or more switches is closed;

switch control circuitry configured to, at different times, cause all the switches to close and, separately for each transistor, cause the switch associated with each transistor to close while causing all other switches to open; and measurement circuitry coupled to each of the plurality of transistors between each respective switch and the emitter of each respective transistor, the measurement circuitry configured to measure, separately for each of the plurality of transistors, a base-emitter voltage (VBE) when all the switches are closed and a VBE when only the switch associated with each transistor is closed, the measurement circuitry further configured to determine a ΔVBE for each of the plurality of transistors by calculating, for each of the plurality of transistors, a difference between the VBE when only the switch associated with each transistor is closed and the VBE when all the switches are closed, the measurement circuitry further configured to calculate an average of all of the determined ΔVBEs.

2. The integrated circuit of claim 1, wherein the measurement circuitry is further configured to calculate a temperature based on the calculated average of all of the determined ΔVBEs.

3. The integrated circuit of claim 1, wherein the measurement circuitry comprises an analog-to-digital converter for converting the calculated average of all of the determined ΔVBEs from an analog value to a digital value.

4. The integrated circuit of claim 1, wherein each of the plurality of transistors comprises a bipolar junction transistor.

5. The integrated circuit of claim 4, wherein each of the plurality of bipolar junction transistor comprises a parasitic bipolar junction transistor.

6. The integrated circuit of claim 1, wherein the plurality of transistors comprise four to eight transistors.

7. The integrated circuit of claim 1, wherein the bias current from the current source is selected to be within an operating region of the plurality of transistors.

8. The integrated circuit of claim 7, wherein the bias current from the current source is selected to be between a high injection region and a low injection region of the plurality of transistors.

9. A method for determining a temperature, the method comprising:

for each of a plurality of transistors arranged in parallel, each of the plurality of transistors having an emitter and a base, the emitter of each of the plurality of transistors selectively coupled to a current source via a respective one of a plurality of switches such that a bias current flows from the current source to the emitter of a respective one or more of the plurality of transistors when a respective one or more switches is closed, separately measuring a base-emitter voltage (VBE)

when all the switches are closed and a VBE when only the switch associated with each transistor is closed;

determining a ΔVBE for each of the plurality of transistors by calculating, for each of the plurality of transistors, a difference between the VBE when only the switch associated with each transistor is closed and the VBE when all the switches are closed;

calculating an average of all of the determined ΔVBEs; and calculating a temperature using the average of all of the determined ΔVBEs.

10. The method of claim 9, further comprising converting each of the measured VBEs from an analog value to a digital value.

11. The method of claim 9, wherein each of the plurality of transistors comprises a bipolar junction transistor.

12. The method of claim 11, wherein each of the plurality of bipolar junction transistor comprises a parasitic bipolar junction transistor.

13. The method of claim 9, wherein the plurality of transistors comprise four to eight transistors.

14. The method of claim 9, wherein the bias current from the current source is selected to be within an operating region of the plurality of transistors.

15. The method of claim 14, wherein the bias current from the current source is selected to be between a high injection region and a low injection region of the plurality of transistors.

16. A temperature sensor comprising:

a current source;

a plurality of transistors arranged in parallel, each of the plurality of transistors having an emitter and a base;

a plurality of switches, each of the plurality of switches selectively coupling the current source to the emitter of a corresponding one of the plurality of transistors such that a bias current flows from the current source to the emitter of a respective one or more of the plurality of transistors when a respective one or more switches is closed;

switch control circuitry configured to, at different times, cause all the switches to close and, separately for each transistor, cause the switch associated with each transistor to close while causing all other switches to open; and measurement circuitry coupled to each of the plurality of transistors between each respective switch and the emitter of each respective transistor, the measurement circuitry configured to measure, separately for each of the plurality of transistors, a base-emitter voltage (VBE) when all the switches are closed and a VBE when only the switch associated with each transistor is closed, the measurement circuitry further configured to determine a ΔVBE for each of the plurality of transistors by calculating, for each of the plurality of transistors, a difference between the VBE when only the switch associated with each transistor is closed and the VBE when all the switches are closed, the measurement circuitry further configured to calculate an average of all of the determined ΔVBEs.

17. The temperature sensor of claim 16, wherein the measurement circuitry is further configured to calculate a temperature based on the calculated average of all of the determined ΔVBEs.

18. The temperature sensor of claim 16, wherein the measurement circuitry comprises an analog-to-digital converter for converting the calculated average of all of the determined ΔVBEs from an analog value to a digital value.

19. The temperature sensor of claim 16, wherein each of the plurality of transistors comprises a bipolar junction transistor.

20. The temperature sensor of claim 16, wherein the bias current from the current source is selected to be within an operating region of the plurality of transistors.

\*   \*   \*   \*   \*